US007017490B1

(12) United States Patent
Brown et al.

(10) Patent No.: US 7,017,490 B1
(45) Date of Patent: Mar. 28, 2006

(54) LITHOGRAPHIC FOUNTAIN SOLUTIONS

(75) Inventors: David W. Brown, Ambler, PA (US); Kenneth Breindel, Lansdale, PA (US); Ronald W. Broadbent, Horsham, PA (US); Michael S. Wiggins, Lansdale, PA (US)

(73) Assignee: Cognis Corporation, Cincinnati, OH (US)

( * ) Notice: Subject to any disclaimer, the term of this patent is extended or adjusted under 35 U.S.C. 154(b) by 121 days.

(21) Appl. No.: 10/436,587

(22) Filed: May 13, 2003

Related U.S. Application Data

(60) Provisional application No. 60/380,379, filed on May 14, 2002.

(51) Int. Cl.
*B41F 1/18* (2006.01)
*C09K 3/00* (2006.01)
*G03F 7/00* (2006.01)
*C08L 63/00* (2006.01)

(52) U.S. Cl. .......................... 101/451; 106/2; 430/302; 523/402

(58) Field of Classification Search ................ 523/400, 523/402; 101/451; 106/2; 430/302
See application file for complete search history.

(56) References Cited

U.S. PATENT DOCUMENTS 5,720,800 A * 2/1998 Matsumoto .................... 106/2
5,827,453 A 10/1998 Gross et al.
5,895,605 A 4/1999 Gross et al.
6,110,977 A 8/2000 Gross et al.
6,387,962 B1 * 5/2002 Wiggins et al. ............. 516/134
6,465,605 B1 * 10/2002 Breindel et al. ............ 528/403

* cited by examiner

*Primary Examiner*—Michael J. Feely
(74) *Attorney, Agent, or Firm*—John F. Daniels; Arthur G. Seifert

(57) ABSTRACT

Lithographic fountain solutions containing a surfactant-effective quantity of at least one reaction product comprising the following reactants: (A) at least one compound of formula I $$R^1(X)_3 \quad (I)$$

wherein each X group is a halogen atom or one X group is a halogen atom and two X groups represent an epoxy oxygen atom, which is attached to two adjacent carbon atoms in the $R^1$ group to form an epoxy group, and $R^1$ is an alkanetriyl group containing from 3 to 10 carbon atoms; and (B) at least one compound having formula II $$R^2X(AO)_nY \quad (II)$$

wherein $R^2$ is a substituted or unsubstituted, saturated or unsaturated, organic group having from 1 to 36 carbon atoms; X is —O—, —S—, or $NR^3$— where $R^3$ is hydrogen or a $C_1$–$C_{18}$ alkyl group; each AO group is independently an ethyleneoxy, 1,2-propyleneoxy, or 1,2-butyleneoxy group, n is a number of from 0 to 200; and Y is hydrogen, or Y can be a mercapto group or an amino group or a $C_1$–$C_6$ alkylamino group in place of a terminal —OH group, provided that when Y is mercapto or an amino group or a $C_1$–$C_6$ alkylamino group, n is at least 1.

41 Claims, No Drawings

LITHOGRAPHIC FOUNTAIN SOLUTIONS

CROSS REFERENCE TO RELATED APPLICATION

This application claims the benefit of copending provisional application Ser. No. 60/380,379 filed on May 14, 2002.

FIELD OF THE INVENTION

This invention relates to compositions for use as lithographic fountain solutions and to their methods of use.

BACKGROUND OF THE INVENTION

In the preparation of lithographic fountain solutions, the solutions must posses good wetting properties, especially when used on low-energy substrates, and must not create high levels of foam; must exhibit good distinction between the image and the nonimage; and must have good performance independent of temperature variations.

SUMMARY OF THE INVENITON

The present invention relates to lithographic fountain solutions possessing the above attributes, which contain at least one of the following surface-active low foaming reaction products, which are the reaction products comprised of the following reactants:

A) at least one compound of formula I $$R^1(X)_3 \quad \text{(I)}$$

wherein each X group is a halogen atom or one X group is a halogen atom and two X groups represent an epoxy oxygen atom, which is attached to two adjacent carbon atoms in the $R^1$ group to form an epoxy group, and $R^1$ is an alkanetriyl group containing from 3 to 10 carbon atoms; and B) at least one compound having the formula II $$R^2X(AO)_nY \quad \text{(II)}$$

wherein $R^2$ is a substituted or unsubstituted, saturated or unsaturated, organic group having from 1 to 36 carbon atoms; X is —O—, —S—, or $NR^3$— where $R^3$ is hydrogen or a $C_1$–$C_{18}$ alkyl group; each AO group is independently an ethyleneoxy, 1,2-propyleneoxy, 1,2-butyleneoxy group, n is a number of from 0 to 200, preferably from 1 to 100, more preferably from 2 to 20; and Y is hydrogen, or Y can be a mercapto group or an amino group (amino or $C_1$–$C_6$ alkylamino group) in place of a terminal —OH group, provided that when Y is mercapto or an amino group or a $C_1$–$C_6$ alkylamino group, n is at least 1.

The mole ratio of the linking compound (I) to (II) is from 0.1:1 to 5:1, preferably from 0.6:1 to 2:1, more preferably from 0.8:1 to 2:1 and most preferably from 1.0:1 to 1.5:1.

The lithographic fountain solutions contain from 0.001 to 5% by weight of the above reaction products, preferably from 0.1 to 3%.

This invention also relates to methods for using the lithographic fountain solutions of the invention.

SUMMARY OF THE INVENTION

Other than in the operating examples, or where otherwise indicated, all numbers expressing quantities of ingredients or reaction conditions used herein are to be understood as modified in all instances by the term "about".

In the above compounds of component A), the linking compound of formula I is preferably epichlorohydrin or another epihalohydrin. Also, trihaloalkanes can be used, such as 1,2,3-trichloropropane, 1,2,4-trichlorobutane, 1,3,6-trichlorohexane, and the like. Instead of chlorine in the epihalohydrins and the trihaloalkanes, the corresponding bromine and iodine compounds can also be used, including compounds containing two or even all three of the above halogens.

The component B) compounds of formula II are organic (optionally alkoxylated) alcohols or the corresponding sulfhydryl or amine compounds.

The $R^2$ group can be a substituted or unsubstituted, saturated or unsaturated hydrocarbon group having from 1 to 36 carbon atoms. Examples of such hydrocarbon groups include linear or branched alkyl groups having from 1 to 36 carbon atoms, preferably from 4 to 22 carbon atoms, linear or branched alkenyl or alkynyl groups having from 2 to 36 carbon atoms, preferably from 4 to 22 carbon atoms, aryl groups having from 6 to 22 carbon atoms, and arenyl groups having from 7 to 36 carbon atoms. Arenyl groups are alkyl-substituted aromatic radicals having a free valance at an alkyl carbon atom such as a benzylic group.

The $R^2$ group can also be a saturated carbocyclic group, an unsaturated carbocyclic group having one or more multiple bonds, a saturated heterocyclic group, or an unsaturated heterocyclic group having one or more multiple bonds. Any of the above $R^2$ groups can be substituted groups, i.e. the groups can be single or multiple substituents such as one or more halogen substituents, for example, Cl, Fl, I, and Br; a sulfur functionality such as a mercaptan or thio group, a nitrogen functionality such as an amine or amide functionality; an alcohol functionality, a silicon functionality, e.g., a siloxane; an ether functionality, e.g. a $C_1$–$C_6$ alkoxy group; or any combination thereof.

The $R^2$ group in formula II is preferably a branched chain alkyl group containing from 4 to 36 carbon atoms, preferably from 4 to 12 carbon atoms, and more preferably from 8 to 10 carbon atoms.

When the X group of formula II is an —S— group, the $R^2$ group will preferably have from about 4 to about 22 carbon atoms, examples of which include but are not limited to, dodecyl mercapto and 1-hexadecanethio.

When the $R^2$X-group of formula II is a secondary or tertiary amino group, the group preferably contains from 4 to 22 carbon atoms, and n is preferably a number of from 1 to 50. Examples of primary and secondary amines useful for obtaining the $R^2$X-group include, but are not limited to, dibutyl amine, cyclohexyl amine, isodecyl amine, and dioctylamine.

Optionally an additional component C) can be reacted with the linking agent of formula I and the compound of formula II. A glycidyl ether or amine can be added to the reaction of formula I and formula II. The amount of the glycidyl ether or glycidyl amine is from about 1 to about 20 mole percent based on the moles of the compounds of formula II used in the reaction. When the glycidyl ether or glycidyl amine is added, the ratio of component A) plus the glycidyl ether or glycidyl amine to component B) is preferably from about 1.2:1 to about 5:1. Examples of glycidyl ether include, but are not limited to, PEG 600 diglycidyl ether, TETRONIC™ 701 tetraglycidyl ether, triglycidyl di- or triethanolamine, polyoxyethylene (POE) 200 tallow amine diglycidyl ether, propoxylated (POP 10) trimethylol propane triglycidyl ether, propoxylated (POP7) pentaerythritol tertraglycidyl ether. Examples of glycidyl amines include, but are not limited to, tetraglycidyl 1,6-hexane diamine, tetraglycidyl JEFFAMINE™ EDR-148, and tetraglycidyl isophorone diamine.

When Y in formula II is an amine or sulfhydryl group, the resulting compounds can be readily prepared from the corresponding alcohols wherein the terminal hydroxy group is replaced by an —SH group or by an amine nitrogen. For example, a compound of formula II where Y is —OH can be subjected to a catalyzed ammoniation (with ammonia, or a lower alkylamine) for replacement of the hydroxyl.

In the compounds of formula II, the AO groups when present are preferably all ethyleneoxy groups. However, as stated above, each OA group can be independently an ethyleneoxy (EO), 1,2-propyleneoxy (PO), or 1,2-butyleneoxy (BO) group, i.e. any one or more of such groups can be present, and they can be present in any order, as well as be present in blocks, e.g. compounds of formula III:

$$R^2O(EO)_m(PO)_p(BO)_qH \quad \text{(III)}$$

wherein $R^2$ has the meaning given above, m is a number of from 0 to 100, preferably from 1 to 50, p is a number of from 0 to 50, e.g. from 1 to 50, and q is a number of from 0 to 50, e.g. from 1 to 50. Compounds of formula III in which $R^2$ is a branched chain alkyl group having from 4 to 12 carbon atoms, m is a number of from 2 to 20, and p and q are 0 are preferred.

The degree of hydrophilic and hydrophobic properties of the reaction products of components A) and B) can be readily controlled by controlling the type and number of alkyleneoxy groups in component B). For example, the greater the number of ethyleneoxy groups present, the greater the water solubility, while the presence of 1,2-propyleneoxy groups and/or 1,2-butyleneoxy groups for example, will decrease water solubility. Also, in general, the longer the R group, the less the water solubility.

In general, the compounds of formula III wherein the sum of n, m, and p is at least 1, and especially at least 2 are preferred for use herein.

The above reaction products can be prepared by the process disclosed in U.S. Pat. No. 5,827,453, the disclosure of which is expressly incorporated herein by reference.

In general, the component A) and B) (and C) if present) reactants are reacted together, preferably in the presence of an inert organic solvent such as toluene that will azeotrope water, and in the presence of a base, such as aqueous sodium hydroxide, at a temperature of from 60° to 125° C. Preferably component B) is first mixed with the base and the organic solvent, and water is removed by azeotropic distillation. Then component A) (and C) if present) is slowly added and the reaction continued until the reaction is completed. The reaction mixture is filtered and vacuum stripped to remove the organic solvent.

The above reaction products are readily soluble in other surfactants that might be present in the lithographic fountain solutions; are both surfactants and defoaming agents; are highly stable yet readily biodegradable; and in addition posses all of the advantages discussed above, i.e. provide the lithographic fountain solutions with good wetting properties; provide good distinction between the image and non-image in lithography; and exhibit good performance independent of temperature variations.

Lithography is a term applied to planographic printing processes depending on the mutual repulsion of water and greasy ink. Damp rollers pass over the surface of the substrate, followed by inking rollers. The printing design, which is greasy, repels the water but retains the ink, which is transferred to the substrate. In current practice, a metal or paper plate is used, which is attached to a cylinder for rotary printing, either sheet-fed or web-fed. Most lithography is offset, i.e. the impression from the plate is transferred to a rubber-covered blanket cylinder, and from there to the stock, which can be paper, board, or other flexible sheets including metal.

The term "small offset" is a term applied to sheet fed offset lithographic machines with a sheet size below that of about 375×500 mm.

Lithographic printing is also used to a lesser extent for relief printing, commonly called letterset printing.

Chromolithography is the preparation of lithographic printing surfaces for single or multicolor printing, by hand methods only. For multicolored printing, an outline is made and transferred to the required number of plates, on each of which the litho artist draws those portions which are required by the color to be used when printing.

Lithographic fountain solutions are the aqueous solutions used in the watering system. These aqueous solutions can be water itself, but are usually water-alcohol mixtures that are used to wet the nonprinting areas of the plate. The alcohol is usually ethanol, but other water miscible lower alcohols can be used, such as isopropyl alcohol, propyl alcohol, methyl alcohol, and the like.

Lithography is a planographic process—that is, the pictures and text on a lithographic plate are on the same plane, or surface, as the nonimage, background areas of the plate. In contrast, in letterpress reproduction the image and text areas are raised above the nonimage area of the printing plate, and in gravure reproduction the subject matter to be reproduced is engraved or recessed below the surface, nonimage areas of the plate.

In the preparation of a plate for printing, an image is made on the plate. Water or a water/alcohol mixture is then applied to the plate; it wets the nonimage area and is repelled by the image area. Next the greasy ink film is applied; it adheres to the image that has repelled the aqueous solution. It does not adhere to the wetted, nonimage area, because grease and water do not mix. When a paper or other material is applied to the plate, the ink is transferred from the image areas and the water from the nonimage areas. This creates an inked image on the receiving surface and a water-dampened non-image area that soon dries.

In direct lithography, reproductions are made by direct contact between paper and plate. Artists use this method when they wish to make multiple copies of their original work. The picture may be drawn with crayon or in ink on a litho plate of stone or metal. The drawing is done in reverse as a mirror image, so that it will appear in its proper form when transferred to paper. To avoid the difficulty of drawing reversed images, the original picture is often drawn on a special transfer paper. When the transfer paper is applied to the litho plate, the image is automatically reversed.

After the picture has been applied to the plate, the plate is prepared as previously described. Reproductions are then made by pressing paper against the inked plate. Usually the artist does this by hand, making only about 100 copies or fewer. Direct lithography provides fine color renditions and reproduces a work of art exactly as it is drawn, including fine detail.

The principal use of lithography today is for mass commercial printing. At first this was done by direct lithography, and as such was not competitive with other forms of printing, but with the advent of offset lithography the process became highly competitive. In offset, the printing plate prints directly onto a rubber "blanket" which is then brought into contact with the paper, and the image is transferred, or offset, from the plate to the blanket to the paper. Because of the resiliency of the rubber blanket the method permits fine-detail printing on rough and course surfaces as well as on smooth ones without affecting plate life—plate life being one of the problems of direct litho printing that was eliminated by offset lithographies.

At first, lithography was used mainly for printing pictures and illustrations. By about the 1830's some printers were making colored lithographic prints, using a technique that came to be known as chromolithography, discussed above briefly. In this process a separate printing plate is made for each color used in a picture, and the paper is printed once with each of these plates. Sometimes as many as 12 different plates were used. The method became a commercial success by the 1850's. In the United States in the late $19^{th}$ century, Currier and Ives were famous for their chromolithographs of everyday life, and in the early $20^{th}$ century advertising posters were also printed in this manner. Such posters used continuous tone printing—that is, the strength of the colors was varied from faint to strong to produce the shades and changes of intensity the printer desired.

Another big advance in lithographic technique was the development of the halftone printing process by American and English workers in the 1860's. Halftoning for the first time permitted the printing of both text and pictures from the same litho plate. In this process, the photographic transparency is remade by photographing it through a screen that breaks the image into a series of dots, which can then be transferred to the litho plate and inked. The size of the dots varies in accordance with the density of the image—that is the darker the image, the larger the dots. The resulting pattern can be made so fine that it looks like a continuous image with varied shadings between light and dark. Newspaper photographs are a good example, because the dot pattern is course enough to be seen easily when the paper is examined with a magnifying glass.

At the same time as halftone techniques were being developed, the process of making lithographic reproductions was being mechanized. The first lithographs were made by hand, with the paper laid on the dampened and inked stone and pressure applied by bearing down on the stone while drawing a stick of wood across the other side of the paper. Because this was a slow and uncertain process that depended greatly on the skill of the individual craftsman, it was not long before machines were built that could squeeze a paper against a lithographic plate.

The first such machines, in the early $19^{th}$ century, were hand-operated, platen-type presses. The plate was carried on the bed of the press and the paper fastened to the platen, which was then pressed down against the plate by means of hand-operated levers. A further improvement was the flatbed press, in which the paper to be printed was attached to a cylinder that rolled the paper over the surface of the litho stone. This in turn was followed by the development of steam-powered rotary flatbed presses in the 1860's. With the advent of zinc plates came the development of rotary presses, in which the plate was curved around the printing cylinder and the paper was passed between this and a backup cylinder called the impression cylinder. Rotary presses used paper sheets and could print about 1,000 of them per hour, as against 600 per hour with flatbed presses.

The most important development in the mechanization of lithography occurred in England in 1875, when R. Barclay of Barclay and Fry developed an offset press that could print on metals. Until the invention of offset, all litho printing had been done directly from plate to paper, and wear and tear through contact with the paper had greatly limited the life of the plate. Besides extending plate life considerably, offset yielded sharper and cleaner prints and made it possible to print on a wide variety of paper or metal surfaces. In fact, offset presses were at first used exclusively for metal printing. It was not until the beginning of the $20^{th}$ century that presses were built for offset printing of paper as well.

The invention of offset was the principal innovation that has made lithographic printing a widely used process. Into the 1950's, nearly all litho offset was done with sheet-fed presses. With the development of improved web offset presses using a continuous web from rolls of paper, faster litho printing has been achieved. Today a large percentage of litho printing is done on web presses. The first web presses printed only one side of the paper web but the later perfector web presses can print both sides simultaneously. A perfector press has a top and bottom blanket cylinder in contact with each other, between which the web is fed.

Color printing has likewise been improved. The first litho color printing was done on presses that had only one plate and printed only one color at a time. With the development of rotary presses, two to five cylinders could be used in sequence so that all colors would be printed in a single pass of a sheet or web through the press. Color printing now is done by means of the four-color process—that is, using red, blue, yellow, and black color-separated halftone images to produce a full range of hues and colors in the final print.

The lithographic fountain solutions of the invention can be used in all lithographic printing that utilize an aqueous solution.

The invention will be illustrated but not limited by the following examples.

EXAMPLES

Example 1

Preparation of the Reaction Product of Decyl Alcohol 4EO and Epichlorohydrin

About 150 grams of decyl alcohol ethoxylated with an average of 4 moles of ethylene oxide (0.45 OH equivalents) were mixed with 385 grams of toluene and 54 grams of 50% aq. NaOH (0.675 equivalents). The water was removed by azeotropic distillation and when a moisture level of less than 0.8% was reached, about 46 grams (0.51 equivalents) of epichlorohydrin were slowly added. This mixture was allowed to react at 100°–110° C. for 24 hours. An aliquot of this mixture was removed and filtered to remove the NaCl and vacuum stripped to remove the toluene to give an amber, easily pourable liquid product that was dispersible in water.

Example 2

A lithographic fountain solution is prepared from the following components:

A) an aqueous mixture of 90% by weight of water and 10% by weight of ethyl alcohol; and B) 0.25% by weight of the reaction product of Example 1.

Example 3

Preparation of the Reaction Product Of Octyl Alcohol•4EO and Epichlorohydrin

About 200.0 gm (0.654 hydroxyl equivs.) of octyl alcohol ethoxylated with an average of 4 moles of ethylene oxide was mixed with 400 gm toluene and 78.4 gm (0.98 equivs.) of 50% NaOH. Water was removed by azeotropic distillation until the level was below 0.8%. The mixture was cooled to 80° C. and 67.2 gm (0.72 moles) of epichlorohydrin was added over 45 mins. The mixture was stirred for 24 hrs at 110° C. until the epoxy titration showed no epoxide left. The material was cooled, filtered and the toluene was removed by vacuum distillation leaving a dark brown low viscosity liquid.

Example 4

A lithographic fountain solution is prepared from the following components:

A) water; and

B) 1% by weight of the reaction product of Example 3.

What is claimed is:

1. In a lithographic fountain solution containing water and optionally a water-miscible alcohol, the improvement wherein the solution contains a surfactant-effective quantity of at least one reaction product comprising the following reactants:

A) at least one compound of formula I $$R'(X)_3 \quad (I)$$

wherein each X group is a halogen atom or one X group is a halogen atom and two X groups represent an epoxy oxygen atom, which is attached to two adjacent carbon atoms in the $R^1$ group to form an epoxy group, and $R^1$ is an alkanetriyl group containing from 3 to 10 carbon atoms; and B) at least one compound having the formula II $$R^2X(AO)_nY \quad (II)$$

wherein $R^2$ is a substituted or unsubstituted, saturated or unsaturated, organic group having from 1 to 36 carbon atoms; X is —O—, —S—, or $NR^3$—where $R^3$ is hydrogen or a $C_1$–$C_{18}$ alkyl group; each AO group is independently an ethyleneoxy, 1,2-propyleneoxy, or 1,2-butyleneoxy group, n is a number of from 0 to 200; and Y is hydrogen, or Y can be a mercapto group or an amino group or a $C_1$–$C_6$ alkylamino group in place of a terminal —OH group, provided that when Y is mercapto or an amino group or a $C_1$–$C_6$ alkylamino group, n is at least 1.

2. The lithographic fountain solution of claim 1 wherein the mole ratio of component A) to component B) is from about 0.1:1 to about 5:1.

3. The lithographic fountain solution of claim 2 wherein said mole ratio is from about 0.6:1 to about 2:1.

4. The lithographic fountain solution of claim 2 wherein said mole ratio is from about 0.8:1 to about 1.5:1.

5. The lithographic fountain solution of claim 1 wherein component A) is epichlorohydrin.

6. The lithographic fountain solution of claim 1 wherein in formula II, n is a number of from 1 to 100.

7. The lithographic fountain solution of claim 6 wherein n is a number of from 2 to 20.

8. The lithographic fountain solution of claim 7 wherein in component B) n is a number from 2 to 20.

9. The lithographic fountain solution of claim 1 wherein in component B) thereof, the said $R^2$ group is a straight or branched chain alkyl group.

10. The lithographic fountain solution of claim 1 wherein component B) has the formula:

$$R^2O(EO)_m(PO)_p(BO)_qH \quad (III)$$

wherein $R^2$ has the meaning given in claim 1, m is a number of from 0 to 100, p is a number of form 0 to 50, and q is a number of from 0 to 50.

11. The lithographic fountain solution of claim 10 wherein component A) is epichlorohydrin.

12. The lithographic fountain solution of claim 10 wherein the mole ratio of component A) to component B) is from about 0.1:1 to about 5:1.

13. The lithographic fountain solution of claim 12 wherein said mole ratio is from about 0.6:1 to about 2:1.

14. The lithographic fountain solution of claim 12 wherein said mole ratio is from about 0.8:1 to about 1.5:1.

15. The lithographic fountain solution of claim 10 wherein m is a number of from 2 to 20.

16. The lithographic fountain solution of claim 15 wherein p and q=0.

17. The lithographic fountain solution of claim 10 wherein $R^2$ is an alkyl group having from 4 to 12 carbon atoms.

18. The lithographic fountain solution of claim 17 wherein $R^2$ is a branched alkyl group.

19. The lithographic fountain solution of claim 10 wherein $R^2$ is an alkyl group having from 4 to 12 carbon atoms, m is a number of from 4 to 50, and p and q=0.

20. The lithographic fountain solution of claim 19 wherein component B) is isodecyl alcohol•4EO.

21. The lithographic fountain solution of claim 1 wherein said surfactant-effective amount is from about 0.001 to about 5% by weight, based on the weight of the solution.

22. In a method of printing using lithography and a lithographic fountain solution, the improvement wherein the lithographic fountain solution contains a surfactant-effective quantity of at least one reaction product comprising the following reactants:

A) at least one compound of formula I $$R'(X)_3 \quad (I)$$

wherein each X group is a halogen atom or one X group is a halogen atom and two X groups represent an epoxy oxygen atom, which is attached to two adjacent carbon atoms in the $R^1$ group to form an epoxy group, and $R^1$ is an alkanetriyl group containing from 3 to 10 carbon atoms; and B) at least one compound having the formula II $$R^2X(AO)_nY \quad (II)$$

wherein $R^2$ is a substituted or unsubstituted, saturated or unsaturated, organic group having from 1 to 36 carbon atoms; X is —O—, —S—, or $NR_3$— where $R^3$ is hydrogen or a $C_1$–$C_{18}$ alkyl group; each AO group is independently an ethyleneoxy, 1,2-propyleneoxy, or 1,2-butyleneoxy group, n is a number of from 0 to 200; and Y is hydrogen, or Y can be a mercapto group or an amino group or a $C^1$–$C_6$ alkylamino group in place of a terminal —OH group, provided that when Y is mercapto or an amino group or a $C_1$–$C_6$ alkylamino group, n is at least 1.

23. The method of claim 22 wherein the mole ratio of component A) to component B) is from about 0.1:1 to about 5:1.

24. The method of claim 23 wherein said mole ratio is from about 0.8:1 to about 2:1.

25. The method of claim 22 wherein said mole ratio is from about 1.0:1 to about 1.5:1.

26. The method of claim 22 wherein component A) is epichlorohydrin.

27. The method of claim 22 wherein in formula II, n is a number of from 1 to 100.

28. The method of claim 27 wherein n is a number of from 2 to 20.

29. The method of claim 22 wherein in component B) the $R^2$ group is a straight or branched chain alkyl group.

30. The method of claim 29 wherein in component B) n is a number from 2 to 20.

31. The method of claim 22 wherein component B) has the formula:

$$R^2O(EO)_m(PO)_p(BO)_qH \quad \text{(III)}$$

wherein $R^2$ has the meaning given in claim 1, m is a number of from 0 to 100, p is a number of form 0 to 50, and q is a number of from 0 to 50.

32. The method of claim 31 wherein component A) is epichlorohydrin.

33. The method of claim 31 wherein the mole ratio of component A) to component B) is from about 0.1:1 to about 5:1.

34. The method of claim 33 wherein said mole ratio is from about 0.6:1 to about 2:1.

35. The method of claim 33 wherein said mole ratio is from about 1.0:1 to about 1.5:1.

36. The method of claim 31 wherein m is a number of from 2 to 20.

37. The method of claim 36 wherein p and q=0.

38. The method of claim 31 wherein $R^2$ is an alkyl group having from 4 to 12 carbon atoms.

39. The method of claim 38 wherein $R^2$ is a branched alkyl group.

40. The method of claim 31 wherein $R^2$ is an alkyl group having from 4 to 12 carbon atoms, m is a number of from 4 to 50, and p and q=0.

41. The method of claim 40 wherein component B) is isodecyl alcohol•4EO.

* * * * *